(12) United States Patent
Derhacobian et al.

(10) Patent No.: US 6,356,482 B1
(45) Date of Patent: Mar. 12, 2002

(54) USING NEGATIVE GATE ERASE VOLTAGE TO SIMULTANEOUSLY ERASE TWO BITS FROM A NON-VOLATILE MEMORY CELL WITH AN OXIDE-NITRIDE-OXIDE (ONO) GATE STRUCTURE

(75) Inventors: Narbeh Derhacobian, Belmont; Michael Van Buskirk, Saratoga; Chi Chang, Redwood City; Daniel Sobek, Portola Valley, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/657,029

(22) Filed: Sep. 7, 2000

Related U.S. Application Data
(60) Provisional application No. 60/184,784, filed on Feb. 24, 2000.

(51) Int. Cl.[7] .................................................. G11C 16/04
(52) U.S. Cl. ........................... 365/185.29; 365/185.03; 365/185.18
(58) Field of Search ....................... 365/185.29, 185.03, 365/185.18

(56) References Cited

U.S. PATENT DOCUMENTS

| | | | |
|---|---|---|---|
| 4,173,766 A | | 11/1979 | Hayes ........................ 357/23 |
| 5,077,691 A | | 12/1991 | Haddad et al. ............. 365/218 |
| 5,349,221 A | | 9/1994 | Shimoji ...................... 257/324 |
| 5,768,192 A | | 6/1998 | Eitan ...................... 365/185.24 |
| 6,011,725 A | * | 1/2000 | Eitan ...................... 365/185.33 |
| 6,026,026 A | * | 2/2000 | Chan et al. ......... 365/185.29 X |
| 6,137,718 A | * | 10/2000 | Reisinger ............... 365/185.03 |
| 6,201,737 B1 | * | 3/2001 | Hollmer et al. ........ 365/185.16 |
| 6,215,702 B1 | | 4/2001 | Derhacobian et al. |

\* cited by examiner

*Primary Examiner*—Huan Hoang
(74) *Attorney, Agent, or Firm*—Fliesler Dubb Meyer & Lovejoy LLP

(57) ABSTRACT

An erase operation is performed on a non-volatile memory cell with an oxide-nitride-oxide structure having charge stored near both the source and drain. During the erase operation, a negative gate erase voltage is applied along with a positive source and drain voltage to improve the speed of erase operations and performance of the non-volatile memory cell after many program-erase cycles.

6 Claims, 7 Drawing Sheets

US 6,356,482 B1

USING NEGATIVE GATE ERASE VOLTAGE TO SIMULTANEOUSLY ERASE TWO BITS FROM A NON-VOLATILE MEMORY CELL WITH AN OXIDE-NITRIDE-OXIDE (ONO) GATE STRUCTURE

CROSS-REFERENCE TO PROVISIONAL APPLICATION

This Patent Application claims the benefit of Provisional Application No. 60/184,784 filed Feb. 24, 2000.

TECHNICAL FIELD

The present invention relates to a non-volatile memory, and more particularly, to a method of performing an erase operation on a non-volatile memory cell with an oxide-nitride-oxide (ONO) structure.

BACKGROUND ART

Non-volatile memory devices have been developed by the semiconductor integrated circuit industry for various applications such as computers and digital communications. A variety of non-volatile memory devices with oxide-nitride-oxide (ONO) structures have been developed. An example of a typical non-volatile memory cell with an ONO structure includes a semiconductor substrate with source and drain regions, an oxide-nitride-oxide (ONO) film on top of the substrate surface between the source and the drain, and nitride layer on top of the first oxide layer, and a second oxide layer on top of the nitride layer. The nitride layer of the ONO film is capable of trapping electrons which are generated in the channel region of the semiconductor substrate during a programming operation.

The conventional non-volatile memory cell with a typical ONO structure is programmed by generating hot electrons in the vicinity of the drain region in the substrate and injecting the hot electrons into the ONO film. The hot electrons are trapped in a portion of the nitride layer close to the drain of the non-volatile memory cell. Because the nitride layer is an insulator, the hot electrons tend to remain in the portion of the nitride layer close to the drain without dispersing into other portions such as the center of the nitride layer.

The presence of negative charge in the portion of the nitride layer adjacent the drain indicates that at least the drain side of the non-volatile memory cell is in a "programmed" state. The non-volatile memory cell with a typical ONO structure may be programmed by applying high positive voltages to the gate and the drain, and grounding the source to inject hot electrons into the portion of the nitride layer adjacent the drain. An example of typical gate and drain voltages applied during programming are $V_G$=9.0V and $V_D$=4.0V. The program technique described is called channel hot electron programming.

A programming procedure may also be applied to inject hot electrons into the nitride layer of a cell close to the source. To provide electrons in the nitride layer near the source, a positive gate and source voltage are applied while the drain is grounded.

FIG. 1 shows a cross-sectional view of a non-volatile memory cell 2 which comprises a substrate 4, an oxide-nitride-oxide (ONO) film 6 including a first oxide layer 8 on top of the substrate 4, a nitride layer 10 of top of the first oxide layer 8, and a second oxide layer 12 on top of the nitride layer 10. A polysilicon gate 14 is provided on top of the second outside layer 12. Portions of the substrate 4 are doped with a group V element, such as arsenic, to form a source region 16 and a drain region 18. The source and drain regions 16 and 18 may be produced by implanting arsenic into the substrate 4 to a depth in the range of about 300 Å to about 600 Å. The ONO film 6 is positioned on top of a surface of the substrate 4 between the source 16 and the drain 18.

The first oxide layer 8, which is also called a tunnel oxide layer, is positioned directly on top of the surface portion 20 of the substrate 4 between the source 16 and the drain 18. A channel exists in the substrate 4 beneath the first oxide layer 8 between the source 16 and drain 18. The first oxide layer 8 may have a thickness on the order of about 75 Å.

The nitride layer 10, which is positioned on top of the first oxide layer 8, is capable of trapping hot electrons which are generated in the channel and injected into a portion 34 of the nitride layer 10 close to the drain region 18 during a typical programming operation. The nitride layer 10 may have a thickness on the order of about 75 Å. The second oxide layer 12, which is positioned on top of the nitride layer 10, has a thickness typically on the order of about 100 Å. The gate 14, which is positioned on top of the second oxide layer 12, may be a conventional polysilicon gate which serves as a control gate for the non-volatile memory cell. The ONO film 6, which comprises the first oxide layer 8, the second oxide layer 12 and the nitride layer 10 sandwiched between the first and second oxide layers 8 and 12, may be fabricated by using conventional techniques known to a person skilled in the art.

FIG. 1 further shows portions of cross-sectional views of additional memory cells 22 and 24 adjacent the memory cell 2 in a non-volatile memory array. The non-volatile memory cells 22 and 24 each have a device structure identical to the non-volatile memory cell 2 described above. Furthermore, two adjacent non-volatile memory cells share a common arsenic-doped region which serves both as the drain for one of the cells and as the source for the other cell. For example, the arsenic-doped region 16, which serves as the source for the non-volatile memory cell 2, also serves as the drain for the non-volatile memory cell 22. Similarly, the arsenic-doped region 18, which serves as the drain for the non-volatile memory cell 2, also serves as the source for the non-volatile memory cell 24. The drain regions 16 and 18 are buried beneath oxide regions 15 and 17 used to isolate individual cells.

FIG. 2 shows a typical electron charge distribution in the substrate 4 after a typical programming operation in which channel hot electrons are generated in the substrate 4 and then trapped in the nitride layer 10 near the drain 18. When the non-volatile memory cell 2 is programmed by applying a high gate and drain voltage while grounding the source, negative charge 32 is stored in the nitride layer 10 and is localized in the area 34 near the drain 18. The hot electrons are trapped in the localized area 34 of the nitride layer 10 and remain localized without spreading or dispersing into other regions since the nitride layer 10 is an insulator.

FIG. 3 illustrates the distribution of electrons when the non-volatile memory cell 2 is programmed by applying a high source and gate voltage while grounding the drain. As shown, by programming with a high source voltage, negative charge 32 is stored in the nitride layer 10 and is localized in the area 36 near the source. The hot electrons are trapped in the localized area 36 and remain localized without spreading or dispersing.

A single cell can be programmed using the programming procedure where a high drain and gate voltage is applied while the source is grounded, as well as the procedure where a high source and gate voltage is applied while the drain is grounded. After both procedures are applied, electrons will be distributed in the nitride layer 10 in both localized regions 34 and 36, as shown in FIG. 4. As further illustrated in FIG. 4, the center of the nitride layer 10 tends to be free of electrons, and the electron distribution does not significantly disperse.

To read the programmed state of the cell programmed, as shown in FIG. 2, in a first (normal) procedure, a positive gate voltage is applied along with a positive source voltage while the drain is grounded. With the cell programmed, a greater threshold voltage $V_T$ will be created, so a greater gate to source voltage must be applied for the cell to conduct during read. With a higher threshold voltage, for the same read voltage applied, less source to drain current will flow.

A second (complementary) read procedure can be applied with the cell programmed as shown in FIG. 2 which uses a positive gate voltage applied along with a positive drain voltage and the source grounded. With the electrons stored near the drain in region 34, using the complementary read procedure the cell will not significantly change in threshold, unlike when the normal procedure is applied. Thus, using the complementary read procedure, the cell will appear to be unprogrammed whether or not electrons are stored in the region 34.

FIGS. 5A and 5B illustrate both the normal and complementary read procedures applied when a cell has been programmed to store electrons only in the area 34 as shown in FIG. 2. As shown in FIG. 5A, in the normal read procedure a gate voltage of 4.0 volts is applied with a source voltage of 1.4 volts and the drain grounded. With the normal read procedure, as the program time is increased to increase the number of electrons stored in the area 34 of the nitride layer 10, the source to drain cell current significantly decreases as shown in FIG. 5A and the cell threshold increases significantly as shown in FIG. 5B. In the complementary read procedure, as shown in FIG. 5B, a gate voltage of 4.0 volts is applied with a drain voltage of 1.4 volts and a source grounded. With the complementary read procedure, as the program time is increased, the source to drain cell current does not significantly change as shown in FIG. 5A, and the threshold also does not significantly indicate any change as shown in FIG. 5B.

The isolation of the electrons in the areas 34 and 36 of the nitride layer 10 during programming enables the cell structure of FIG. 1 to be used to store two bits of information when the cell is programmed as shown in FIG. 4. With the electrons stored in region 34, the normal read procedure described above can be used to determine the state of the first bit stored. With electrons stored in the region 36, the complementary read procedure can be used to read the cell state in a manner similar to the normal read procedure with electrons stored in region 34. The electrons stored in the region 36 will not significantly affect the normal read procedure. With electrons stored in region 36, the complementary read procedure described above can, thus, be used to determine the state of the second bit stored.

In another conventional structure for a non-volatile memory cell shown in FIG. 6, a source 16 and drain 18 are provided in a substrate 4, but the gate structure is somewhat different from the structure shown in FIG. 1. The gate structure shown in FIG. 6 is made up with an oxide layer 40 supporting a polysilicon floating gate 42, instead of the nitride region 10 of FIG. 1, and another oxide region 44 and polysilicon gate region 46 are placed above the polysilicon floating gate 42. With the structure shown in FIG. 6, after programming electrons will be stored in the polysilicon region 42 and will flow evenly throughout the polysilicon, as illustrated, irrespective of whether a high drain voltage or a high source voltage is used during programming.

After the non-volatile memory cell with the ONO structure of FIG. 1 is programmed, it can be erased by using a conventional technique of drain side hot hole injection. In a typical erase procedure for ONO type non-volatile cells, a gate voltage of 0.0 volts is applied along with a large drain voltage on the order of 4.5–6.0 volts while the source is floated or grounded. Alternatively, the gate voltage of 0.0 volts is applied while the source is at 4.5–6.0 volts and the drain is floated or grounded.

FIG. 7 illustrates conditions during an erase procedure for an ONO cell where electrons have been stored only in the area 34. For the erase procedure illustrated it is assumed that a gate voltage of 0.0 volts is applied along with a high drain voltage, while the source is floated. With such erase conditions a band to band current is created under the gate. Holes will be generated under these conditions and will accelerate from the n type drain region 18 into the p type substrate 4. The holes generated are accelerated in the electrical field created near the p-n junction at area 44. Some of the accelerated holes will surmount the oxide to silicon interface between the substrate 4 and oxide layer 8 and will be injected into the nitride layer 10. The holes reaching the nitride layer 10 will displace the electrons to effectively erase the cell.

A problem after a number of program and erase procedures is that some electrons can remain in the center portion 46 of the nitride region 10 as illustrated in FIG. 8. This phenomena is known as "incomplete erase". Incomplete erase results because during programming some electrons can be injected into the central region 46 of the nitride 10. Typically during program electrons are mainly injected into the region 34, but it is possible that a hot electron will be injected into the center 46. The concentration of electrons over the nitride region 10 during typical programming where a high gate and drain voltage are applied is illustrated in area 48.

Incomplete erase occurs after a number of programming and erase cycles. With only a limited number of programming steps, the concentration of electrons near the center 46 as shown in FIG. 8 will be typically nonexistent, so the erase procedure will eliminate all electrons from the region 34 of the nitride 10. However, after a number of programming cycles, some electrons will be injected into the region 46. During the erase procedures, holes which are injected into the nitride 10 will have the same distribution as shown in plot 48 as electrons, so some holes can be injected into the central region 46 of the nitride. To assure that incomplete erase does not occur a number of erase procedures can be applied to increase the likelihood that hot holes will go into the region 46 to eliminate all electrons. As the number of program cycles are increased, the number of erase cycles after each programming step to assure incomplete erase does not occur will increase.

FIG. 9 shows a diagram of a number of program-erase (P/E) cycles vs. erase time needed to completely erase a cell for typical program and erase procedure voltages. As shown in FIG. 9, the erase time increases significantly as the number of program-erase cycles increases. The erase time increases rapidly from 1 sec to 1.6 sec or above within the first 2,000 program-erase cycles. Before the number of program-erase cycles reaches 5,500, the erase time for each erase operation may be as much as 1.9 sec. FIG. 9 shows the number of program-erase cycles only up to 5,500. In some practical applications, it is desired that a non-volatile memory cell be subjected to a larger number of program-erase cycles. But, it may be impossible or impractical for the non-volatile memory cell to endure more program-erase cycles without failure.

The non-volatile memory cell structure shown in FIG. 6 does not require increased erase time after a number of program-erase cycles because the electrons will evenly distribute after each program procedure and holes will also evenly distribute after each erase procedure to eliminate any electrons and avoid any incomplete erase. However, the non-volatile cell structure of FIG. 1 may still be desirable over the structure of FIG. 6 for a number of reasons. First, the ONO structure of FIG. 1 enables a 20% reduction in processing costs over the structure of FIG. 6. Further the ONO structure of FIG. 1 is less sensitive to defects. Further, the ONO structure enables two bits per cell to be programmed without increased complexity, as described with respect to FIG. 4 since electrons are concentrated in two discrete areas, as opposed to the even distribution with the structure of FIG. 6.

SUMMARY OF THE INVENTION

In accordance with the present invention, an erase procedure is provided for a non-volatile ONO memory cell to remove charge stored near both the drain and the source regions during programming. The erase method includes the step of applying a negative gate voltage. A suggested range for the gate erase voltage is less than 0 V to about −4 V. An initial gate erase voltage may be on the order of −1.0 volts. Since cells are programmed with electrons injected into the nitride near both the drain and source during erase, both a positive drain voltage and a positive source voltage are applied during the erase procedure when the negative gate voltage is applied The drain and source bias voltages during such an erase procedure may be on the order of 6.0 volts. Applying both the positive drain and source voltages with the negative gate voltage during erase enables erase to be performed simultaneously on charge stored near the drain and charge stored near the source to expedite the erase procedure.

BRIEF DESCRIPTION OF THE DRAWINGS

The present invention will be described with reference to the drawings in which.

DETAILED DESCRIPTION

Figure 1:
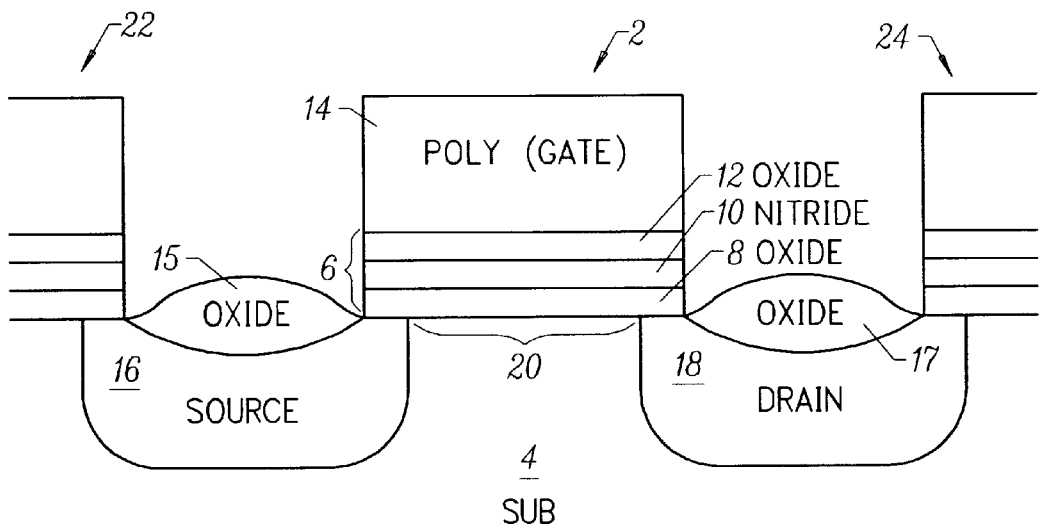
FIG. 1 shows a cross-sectional view of a non-volatile memory cell with an oxide-nitride-oxide (ONO) gate structure.
Figure 8:
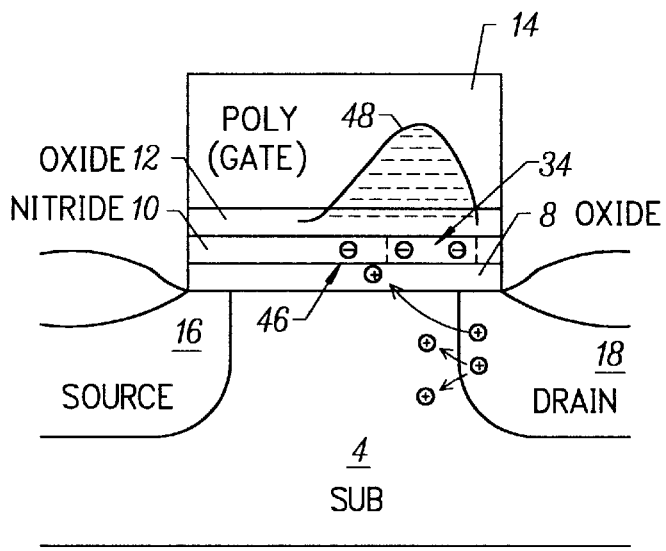
FIG. 8 illustrates the distribution of holes or electrons in the nitride layer of the cell of FIG. 1 after a number of program-erase procedures.

In an erase operation according to the present invention a negative gate voltage is applied rather the 0.0 volts applied to the gate during a typical erase procedure. The negative gate voltage may be applied along with either a high drain voltage and/or a high source voltage to remove electrons stored in regions 34 and 36 of the nitride layer 10 of an ONO cell as shown in FIG. 1. With the negative gate voltages, holes which are generated at a p-n junction in the substrate, such as between the drain 18 and substrate 4 shown in FIG. 8, are accelerated to a greater degree than if a 0.0 volt gate voltage is applied to better assure holes will be provided in the central region 46 of the nitride 10 to remove any electrons there, Compared with a significant amount of negative charge accumulated in the center region 46 of the nitride 10 after conventional erase operations where a 0.0 volt gate voltage is applied, the amount of negative charge 56 in the center 46 of the nitride 10 after the same number of erase operations are applied with a negative gate erase voltage according to the present invention is significantly reduced.

In accordance with the present invention, a negative gate voltage is applied during erase to the gate 14 of the non-volatile ONO memory cell 2. as shown in FIG. 1. The gate voltage applied may range from less than 0 V to about −4 V. An initial negative gate voltage applied during erase may be on the order of 1.0 volt. As the number of program-erase cycles is increased, the negative gate voltage may be decreased toward −4.0 volts to reduce the erase time needed to assure incomplete erase does not occur. During initial program-erase cycles, the small decrease in gate voltage from 0.0 volts around −1.0 volt can result in a significant decrease in erase time required after thousands of program-erase cycles.

With cells programmed with electrons injected into the nitride 10 in the area 34 near the drain 18, during the erase procedure in accordance with the present invention a positive drain voltage is applied while the source 16 is either floated or grounded when the negative gate voltage is applied. The drain bias voltage is preferably 10 V or less. The drain bias voltage preferably used for a typical sized cell will be on the order of 6.0 volts. Depending upon the physical characteristics of the non-volatile memory cell 2 and the availability of voltage levels provided by internal voltage pumps, the drain bias voltage applied to the drain 18 of the non-volatile memory cell 2 may be optimized. For example, if the non-volatile memory cell 2 is scaled down in size, the drain bias voltage applied to the drain 18 may be scaled down to a relatively low positive bias voltage. Since scaling down the size of the non-volatile memory cell 2 may limit the ability of applying a high voltage to the drain 18 during an erase operation, applying an initial negative gate erase voltage during an erase operation according to the present invention allows the size of the non-volatile memory cell 2 to be scaled down to accommodate a low positive drain bias voltage while maintaining the erase speed.

With cells programmed with electrons injected into the nitride in the area 36 near the source, during the erase procedure in accordance with the present invention a positive source voltage is applied while the drain is either floated or grounded when the negative gate voltage is applied. With erase applied using a high source voltage, the voltage on the source will be similar to the voltages described previously as applied to the drain when erase is performed using a high drain voltage.

Figure 2:
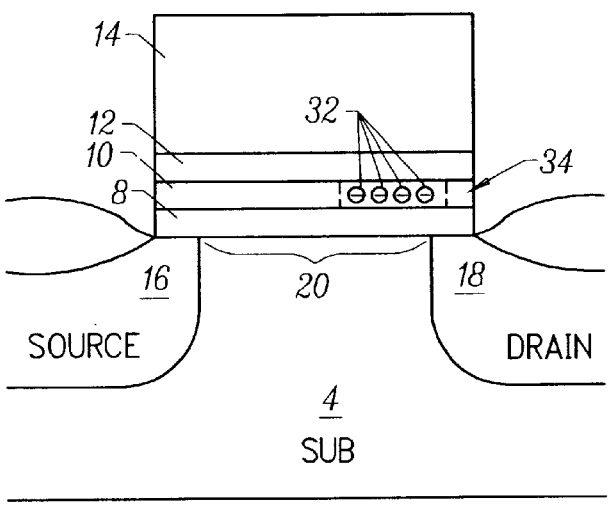
FIG. 2 illustrates electron storage in the nitride layer of the cell of FIG. 1 near the drain region.
Figure 3:
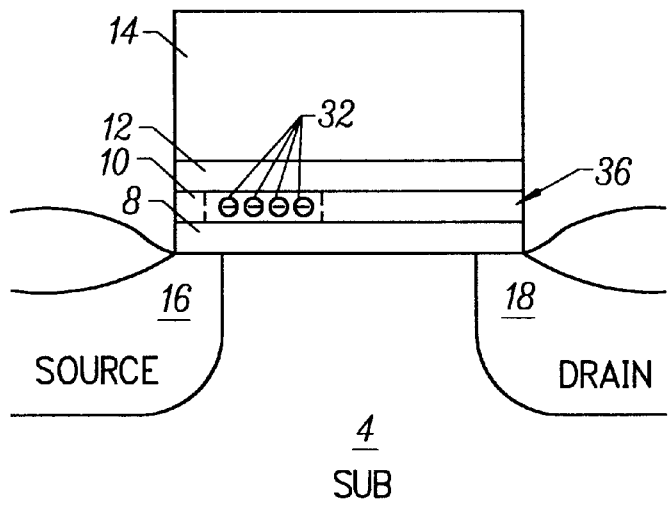
FIG. 3 illustrates electron storage in the nitride layer of the cell of FIG. 1 near the source region.
Figure 4:
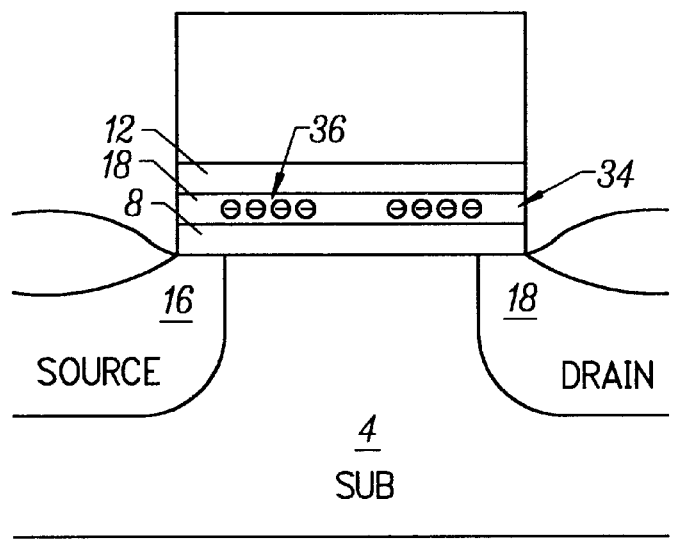
FIG. 4 illustrates electron storage in the nitride layer of the cell of FIG. 1 near both the source and drain regions.
Figure 5A:
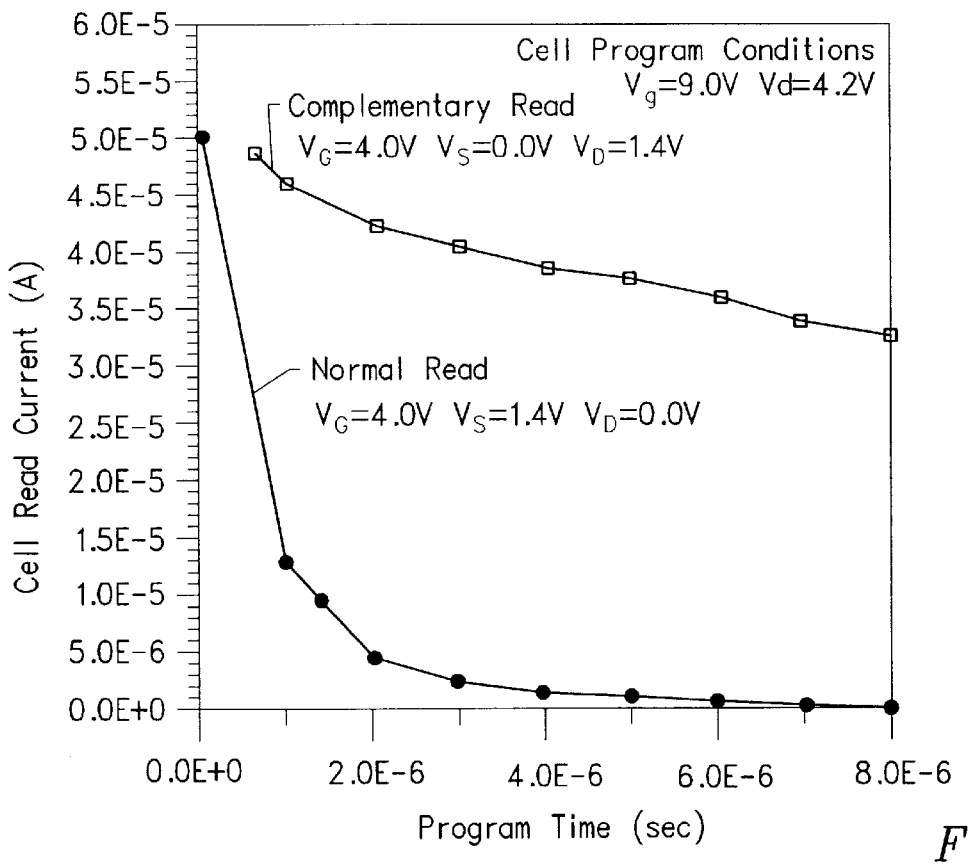
FIG. 5A graphs cell read current vs. program time using both a normal read procedure and a complementary read procedure.
Figure 5B:
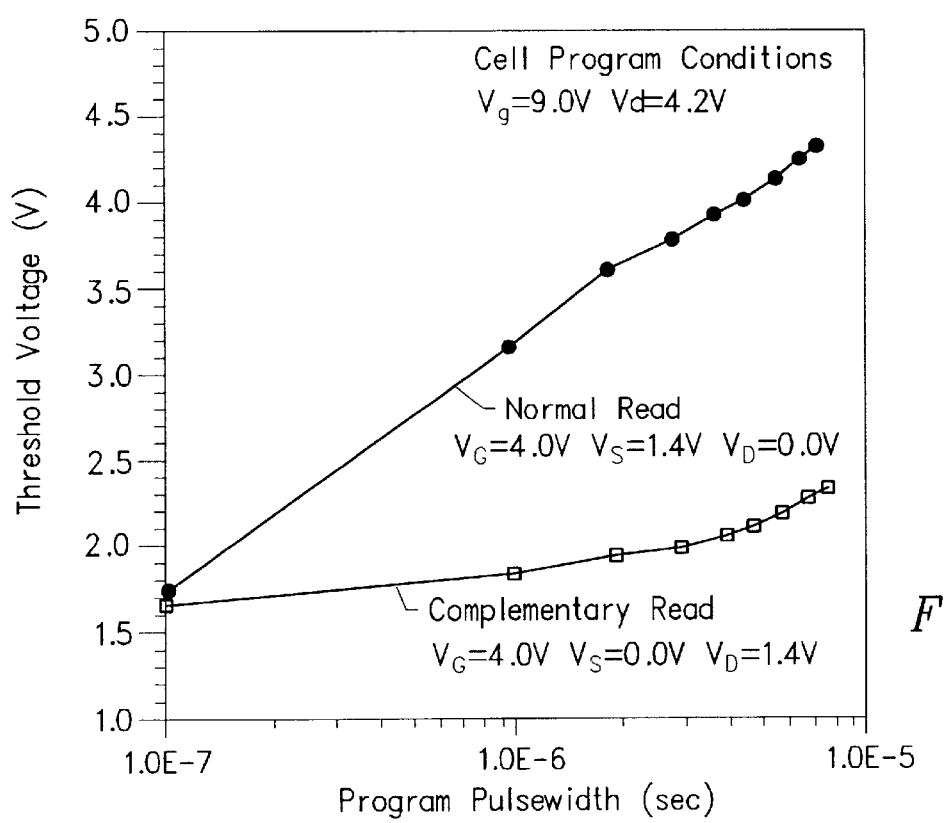
FIG. 5B graphs cell threshold vs program pulse width using both a normal read procedure and a complementary read procedure for determining the threshold state.
Figure 6:
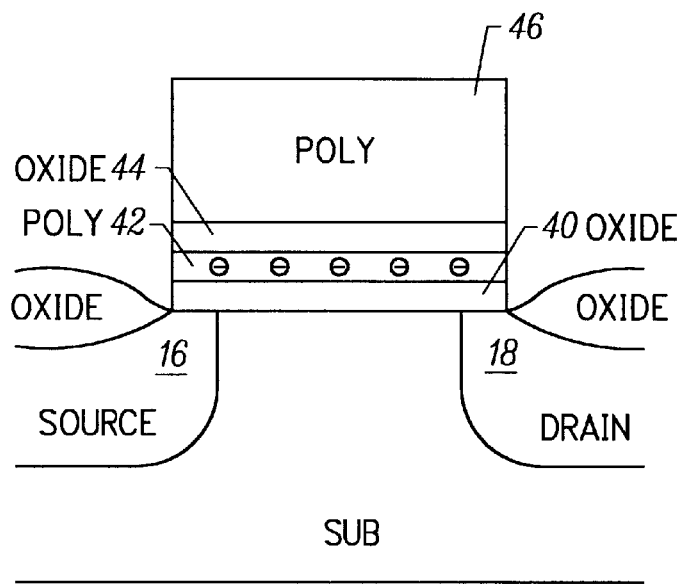
FIG. 6 shows a cross-sectional view of a non-volatile memory cell using a polysilicon gate without a nitride layer, along with an electron distribution after programming.
Figure 7:
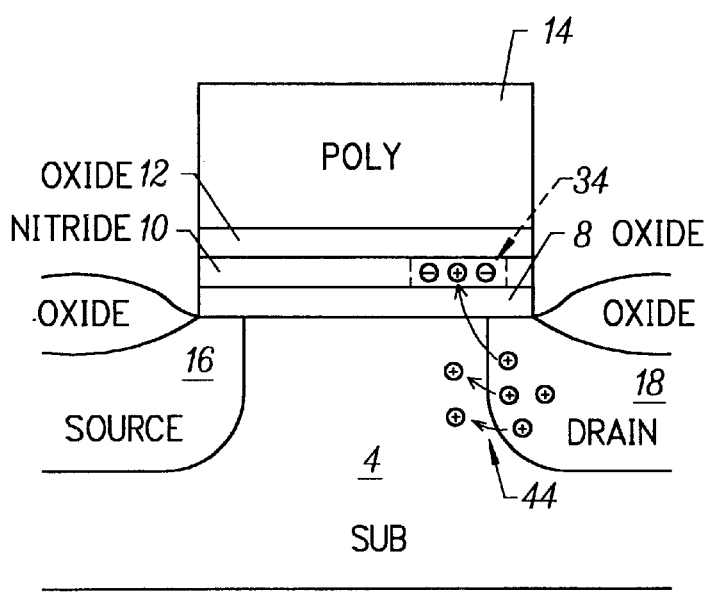
FIG. 7 illustrates the flow of hot holes from the drain to the nitride layer of a cell as shown in FIG. 1 during a typical erase procedure.
Figure 10A:
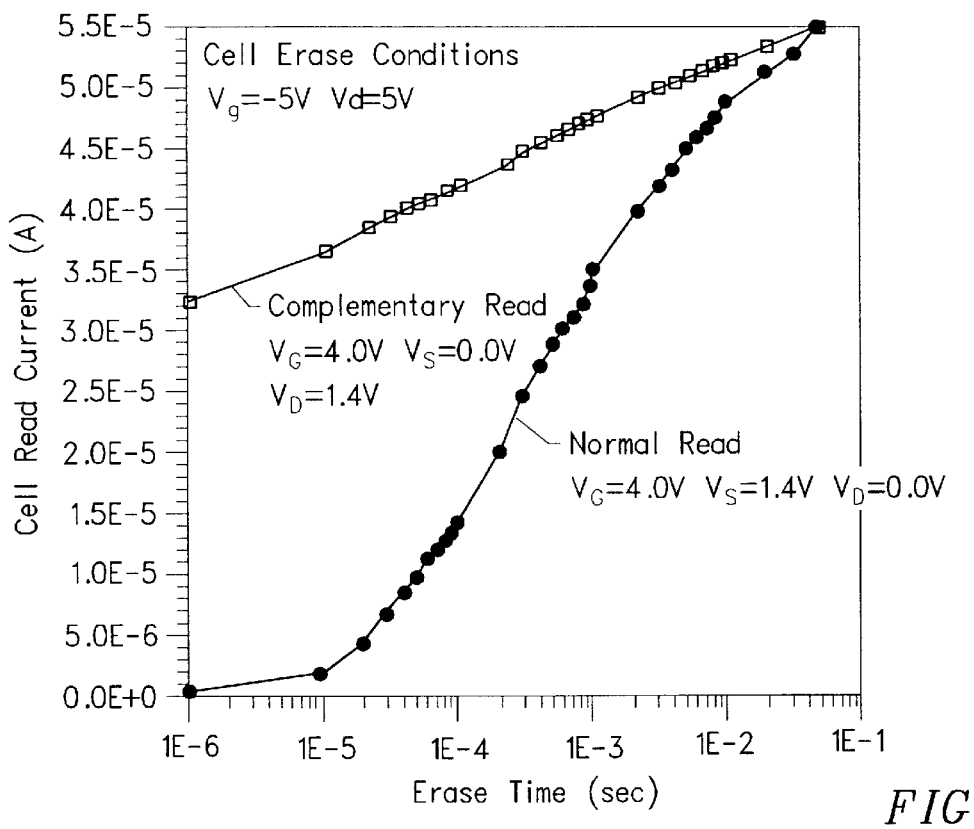
FIG. 10A graphs cell read current vs. erase time using both a normal read procedure and a complementary read procedure.
Figure 10B:
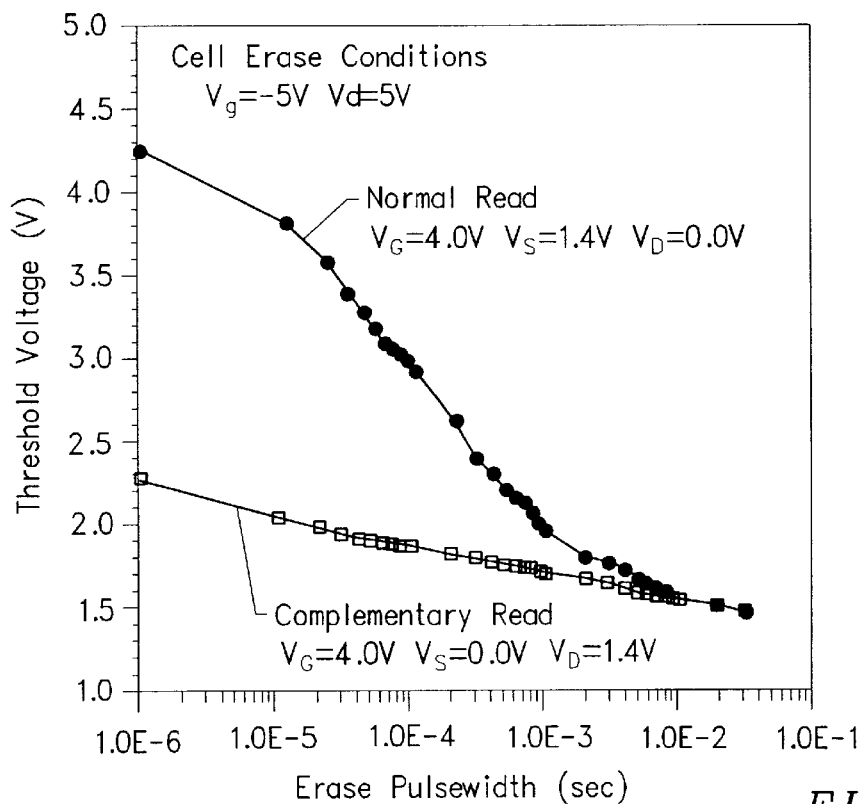
FIG. 10B graphs cell threshold vs. erase pulse width using both a normal read procedure and a complementary read procedure for determining the threshold state.

FIGS. 10A and 10B illustrates both the normal and complementary read procedures applied when a cell has been first programmed to provide electrons in the area 34 as shown in FIG. 2, and then subsequently erased using a high drain voltage while a negative gate voltage is applied to inject holes into the area 34. As shown in FIG. 10A, in the normal read procedure a gate voltage of 4.0 volts is applied with a source voltage of 1.4 volts and the drain grounded. With the normal read procedure, as the erase time is increased to increase the number of electrons stored in the area 34 of the nitride layer 10, the source to drain cell current significantly increases as shown in FIG. 10A and the cell threshold increases significantly as shown in FIG. 10B illustrating that the cell is successfully erased after a period of time. In the complementary read procedure, as shown in FIG. 10A, a gate voltage of 4.0 volts is applied with a drain voltage of 1.4 volts and a source grounded. With the complementary read procedure, as the erase time is increased, the source to drain cell current does not significantly change to identify whether or not the cell has been erased as shown in FIG. 10A, and the threshold also does not significantly indicate any change as shown in FIG. 10B.

The isolation of the electrons in the areas 34 and 36 of the nitride layer 10 during programming, subsequent erase of only electrons in selected ones of areas 34 and 36, and the normal and complementary read procedures enabling the state of the areas 34 and 36 to be individually read allows the procedure of the present invention to be utilized with a ONO cell configured to store two bits of information. With electrons stored in the region 36, the complementary read procedure can be used to read the cell state in a manner similar to the normal read procedure with electrons stored in region 34. The electrons stored in the region 36 will not significantly affect the normal read procedure. Electrons can be erased from region 34 by applying a high source 16 while applying a negative gate voltage and floating or shorting the drain 18.

When electrons are stored in both the nitride regions 34 and 36 to represent two separate bits, the hot electrons trapped in both portions 34 and 36 of the nitride layer 10 may be erased one at a time during an erase operation using a negative gate erase voltage. For example, the hot electrons in the portion 34 of the nitride layer 10 adjacent the drain 18 may be removed by applying a negative gate erase voltage to the gate 14, a positive bias voltage to the drain 18, and floating or grounding the source 16 of the non-volatile memory cell 2. In a similar manner, the hot electrons in the portion 36 of the nitride layer 10 adjacent the source 16 may be removed by applying the negative gate erase voltage to the gate 14, the positive bias voltage to the source 16, and floating or grounding the drain 18 of the non-volatile memory cell 2.

In an alternate embodiment, the hot electrons in both the drain side portion 34 of the nitride layer 10 and the source side portion 36 of the nitride layer 10 may be removed simultaneously by applying a negative gate erase voltage to the gate 14 and applying a positive bias voltage to both the drain 18 and the source 16 of the non-volatile memory cell 2. When both the drain side and the source side of the non-volatile memory cell are erased simultaneously, care should be taken during the application of the positive bias voltage to the source 16 and the drain 18 to avoid a punch-through in the substrate region between the source 16 and the drain 18.

Figure 9:
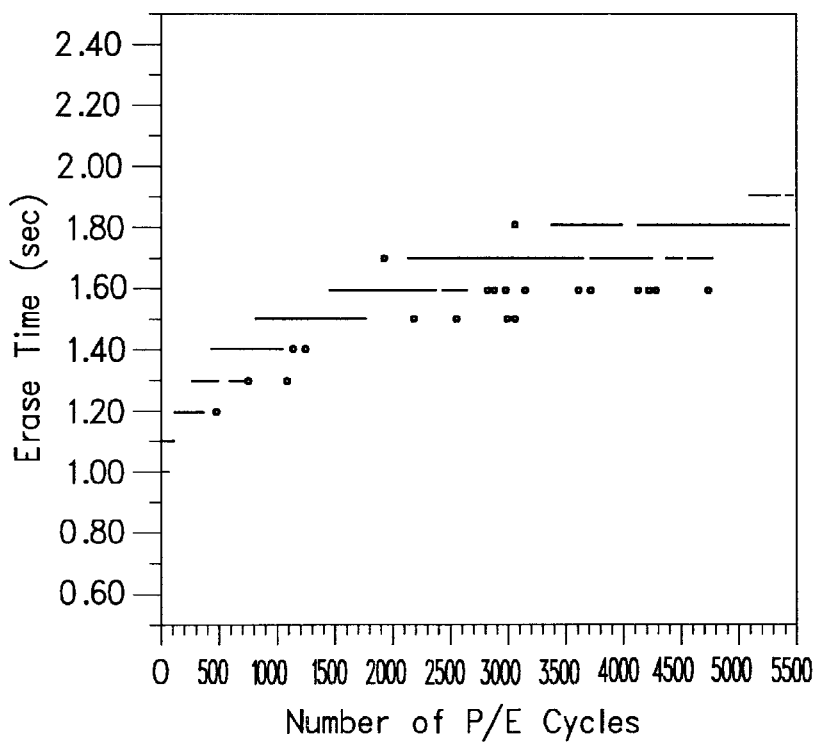
FIG. 9 shows a diagram of a number of program-erase (P/E) cycles vs. erase time needed to completely erase a cell programed and erased using typical procedures.
Figure 11:
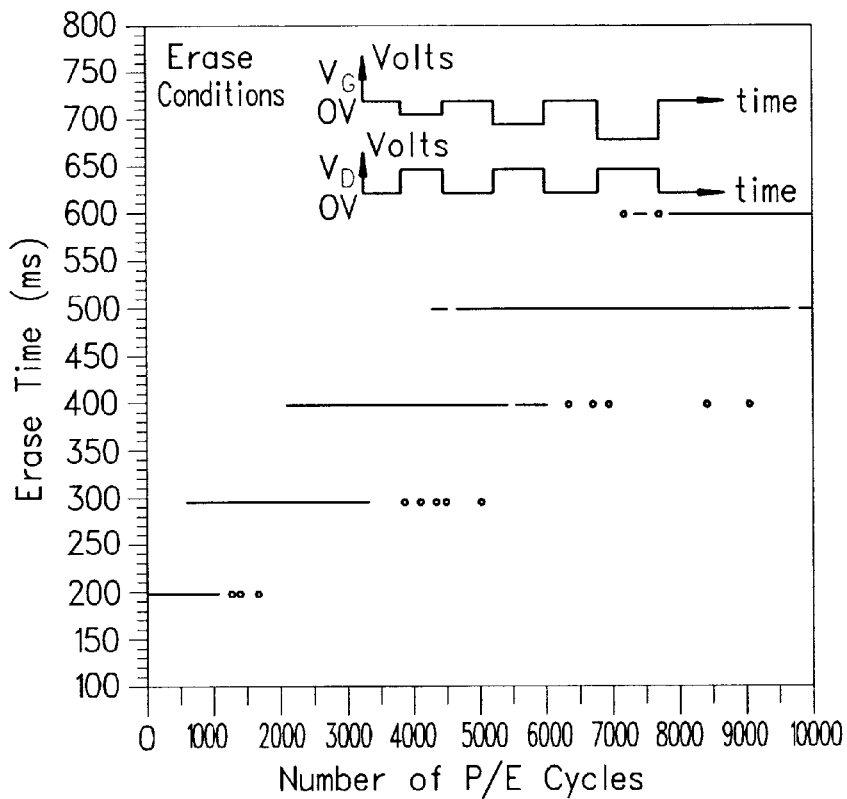
FIG. 11 shows a erase time vs. number of program-erase cycles for the non-volatile memory cell erased using a negative erase voltage.

FIG. 11 shows a diagram of erase time vs. a number of program-erase (P/E) cycles when a negative gate erase voltage is used. For the erase procedure, an initial gate erase voltage of −1.0 volt is used and the gate erase voltage is reapplied with a slightly more negative voltage if erase is incomplete until the cell is determined to be completely erased. Note that the scale for the erase time in FIG. 11 is different from that shown in FIG. 9 described previously. As shown in FIG. 11, the initial erase time can be as short as 100 ms. After 5,000 program-erase cycles, the erase time for each erase operation is as short as 400 ms. Even after 10,000 program-erase cycles which started with an initial gate erase voltage of −1 V, the erase time for each erase operation is no more than 600 ms, which is much less than even the initial erase time of about 1 sec with an initial gate erase voltage of 0 V.

Figure 12:
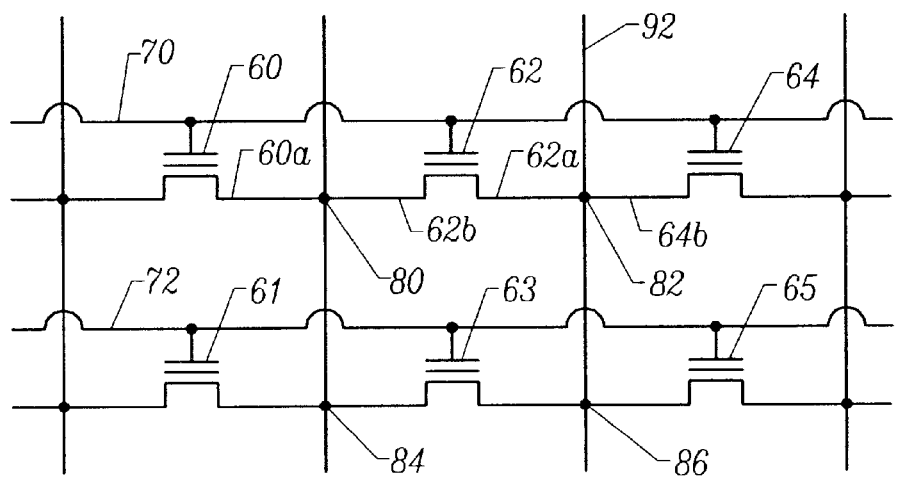
FIG. 12 is a circuit diagram for a non-volatile memory array including a number of non-volatile memory cells of FIG. 4 connected using a number of bit lines and word lines.

FIG. 12 shows a typical circuit diagram of an array of non-volatile memory cells arranged in a plurality of columns and rows. The gates of the memory cells in each row is connected to a respective word line. For example, the gates of the memory cells 60, 62, and 64 are connected to word line 70, whereas the gates of the memory cells 61, 63, and 65 are connected to word line 72.

Since the source and the drain of adjacent memory cells share the same physical arsenic-doped region as shown in the cross-sectional view of FIG. 1, the source and the drain of adjacent memory cells are shown as being connected together in the circuit of FIG. 12. For example, the drain 60a of the memory cell 60 is connected to the source 62b of the memory cell 62 at a node 80, whereas the drain 62a of the memory cell 62 is connected to the source 64b of the memory cell 64 at another node 82. Similarly, the drains and the sources of adjacent memory cells 61, 63 and 65 are connected at nodes 84 and 86 as shown in FIG. 12.

The corresponding source-drain nodes in each column are connected to a respective bit line. For example, the source-drain nodes 80 and 84 are connected to bit line 90 while the source-drain nodes 82 and 86 are connected to bit line 92. The word lines and the bit lines shown in the circuit diagram of FIG. 12 may be provided in a conventional manner known to a person skilled in the art. For example, the bit lines may be provided as conventional buried bit lines connected to the arsenic-doped source-drain regions within the substrate.

The initial negative gate erase voltage allows the non-volatile ONO memory cell to be erased with significantly improved speeds as the number of program-erase cycles increases. Furthermore, with a negative erase voltage, a lower positive drain bias voltage can be used allowing the non-volatile memory cell to be scaled down to a smaller size.

The present invention has been described with respect to particular embodiments thereof, and numerous modifications can be made which are within the scope of the invention as set forth in the claims which follow.

What is claimed is:

1. A method of performing an erase operation on a non-volatile memory cell which comprises a drain and a source in a substrate, a first oxide layer on the surface of the substrate between the source and the drain, a nitride layer on the first oxide layer, a second oxide layer on the nitride layer, and a polysilicon gate layer on the second oxide layer, the memory cell having been programmed by storing electrons in a portion of the nitride layer adjacent the drain and in a portion of the nitride layer adjacent the source, the method comprising the simultaneous steps of:

applying a negative voltage to the gate;

applying a positive bias voltage to the drain; and applying a positive bias voltage to the source;

and wherein the simultaneous steps occur for a duration of at least about 100 ms.

2. The method of claim 1 wherein the erase voltage applied to the gate is in the range of less than 0 volts to about −4 volts.

3. The method of claim 1 wherein the positive drain bias voltage and the positive source bias voltage are approximately equal.

4. The method of claim 1 wherein the duration is less than 1 sec.

5. The method of claim 1 wherein the positive drain bias voltage and the positive source bias voltage are each less than 10 V.

6. The method of claim 5 wherein the positive drain bias voltage and the positive source bias voltage are about 6 V.

* * * * *